(12) United States Patent
Goehler et al.

(10) Patent No.: US 9,636,769 B2
(45) Date of Patent: May 2, 2017

(54) IRRADIATION IN GENERATIVE FABRICATION

(71) Applicant: MTU Aero Engines AG, Munich (DE)

(72) Inventors: Thomas Goehler, Dachau (DE); Thomas Hess, Munich (DE); Tobias Maiwald-Immer, Munich (DE)

(73) Assignee: MTU Aero Engines AG, Munich (DE)

( * ) Notice: Subject to any disclaimer, the term of this patent is extended or adjusted under 35 U.S.C. 154(b) by 187 days.

(21) Appl. No.: 14/567,851

(22) Filed: Dec. 11, 2014

(65) Prior Publication Data

US 2015/0165545 A1 Jun. 18, 2015

(51) Int. Cl.
*B23K 26/342* (2014.01)
*C22B 9/22* (2006.01)
(Continued)

(52) U.S. Cl.
CPC ........ *B23K 15/0006* (2013.01); *B22F 3/1055* (2013.01); *B23K 15/004* (2013.01); *B23K 15/0013* (2013.01); *B23K 15/0086* (2013.01); *B23K 26/02* (2013.01); *B23K 26/342* (2015.10); *C30B 13/24* (2013.01); *C30B 29/52* (2013.01); *B22F 5/009* (2013.01); *B22F 2003/1056* (2013.01); *B22F 2003/1057* (2013.01); *B33Y 10/00* (2014.12); *B33Y 80/00* (2014.12);
(Continued)

(58) Field of Classification Search
CPC ............ B23K 15/0006; B23K 15/0086; B23K 15/0013; B23K 15/004; B23K 26/02; B23K 26/34; B23K 26/345; B23K 26/342; C22B 9/22; C22B 9/223; C22B 9/228

USPC .......................... 219/121.13–121.17, 121.35, 219/121.63–121.66, 121.85; 29/889–889.722
See application file for complete search history.

(56) References Cited

U.S. PATENT DOCUMENTS 5,396,333 A * 3/1995 Aleshin .............. B23K 26/1494
219/121.83
5,701,669 A * 12/1997 Meier ..................... B23P 6/007
29/281.6
(Continued)

FOREIGN PATENT DOCUMENTS

DE 603 12 826 T2 1/2008
DE 10 2009 051 479 A1 5/2011
(Continued)

*Primary Examiner* — Samuel M Heinrich
(74) *Attorney, Agent, or Firm* — Barlow, Josephs & Holmes, Ltd.

(57) ABSTRACT

The present invention relates to a method for the generative production of components, particularly of single-crystalline or directionally-solidified components, particularly for the production of components for turbomachines, in which the component is constructed in layers on a substrate or a previously produced part of the component (3), wherein a construction in layers takes place by melting of powder material in layers with a high-energy beam (14) and solidification of the powder melt (16) takes place, wherein the high-energy beam has a beam cross section (19) in the area of its impingement on the powder material that is altered in comparison to a circular or other symmetrical cross section and/or the beam energy is distributed non-uniformly, in particular asymmetrically or eccentrically, over the beam section.

13 Claims, 2 Drawing Sheets

(51) Int. Cl.
*B23K 15/00* (2006.01)
*B23K 26/02* (2014.01)
*B22F 3/105* (2006.01)
*C30B 13/24* (2006.01)
*C30B 29/52* (2006.01)
*B33Y 10/00* (2015.01)
*B33Y 80/00* (2015.01)
*B22F 5/00* (2006.01)

(52) U.S. Cl.
CPC ............... *C22B 9/22* (2013.01); *C22B 9/223* (2013.01); *C22B 9/228* (2013.01); *Y02P 10/295* (2015.11)

(56) References Cited

U.S. PATENT DOCUMENTS

| | | | | |
|---|---|---|---|---|
| 5,837,960 | A * | 11/1998 | Lewis | B23K 26/34 219/121.63 |
| 6,024,792 | A * | 2/2000 | Kurz | B22F 3/1055 117/13 |
| 6,203,861 | B1 | 3/2001 | Kar et al. | |
| 6,646,728 | B1 * | 11/2003 | Tang | B29C 67/0066 356/121 |
| 2001/0002287 | A1 | 5/2001 | Kar et al. | |
| 2009/0020901 | A1 * | 1/2009 | Schillen | B29C 67/0051 264/31 |
| 2011/0135952 | A1 | 6/2011 | Morris et al. | |
| 2013/0136868 | A1 | 5/2013 | Bruck et al. | |
| 2013/0156586 | A1 * | 6/2013 | Richter | B23K 15/0006 416/213 R |
| 2013/0209976 | A1 * | 8/2013 | Postlethwaite | G09B 19/24 434/234 |
| 2014/0072438 | A1 * | 3/2014 | Bruck | B23K 26/342 416/223 R |
| 2014/0271328 | A1 * | 9/2014 | Burris | B23K 26/034 419/53 |

FOREIGN PATENT DOCUMENTS

| | | |
|---|---|---|
| DE | 10 2010 050531 A1 | 3/2012 |
| DE | 10 2010 048 335 A1 | 4/2012 |
| EP | 0 861 927 A1 | 9/1998 |
| EP | 0 892 090 A1 | 1/1999 |
| EP | 2277687 A1 | 1/2011 |
| WO | 9855257 A1 | 12/1998 |
| WO | 2004/028786 A1 | 8/2004 |
| WO | 2013/029959 A1 | 7/2013 |
| WO | 2014187606 A1 | 11/2014 |

* cited by examiner

IRRADIATION IN GENERATIVE FABRICATION

BACKGROUND OF THE INVENTION

Field of the Invention

The present invention relates to a method for the generative production of components, particularly for the production of components of turbomachines in which the component is constructed in layers on a substrate or on a previously produced part of the component, with construction in layers occurring by melting powder material in layers with a high-energy beam and solidification of the melt.

Prior Art

Generative production methods for producing a component, such as, for example, stereolithographic methods, selective laser melting, selective laser sintering, electron beam melting, or laser deposition welding, are used in the industry for so-called rapid tooling and rapid prototyping or also for the mass production of products within the scope of rapid manufacturing. In particular, such methods can also be used for the production of turbine parts, particularly parts for aircraft engines, in which such generative production methods are advantageous on account of the material used, for example. An example of this is found in DE 10 2010 050 531 A1.

Moreover, owing to the conditions of use and the requisite properties, it is advantageous in the case of components for turbomachines to use single-crystalline or directionally solidified components in order to specifically exploit the anisotropy of properties, such as, for example, different mechanical properties with respect to crystal orientation. Thus, for example, it is known how to produce turbine blades or vanes from single-crystalline or directionally solidified nickel-based superalloys. Here, single crystalline means that the component is formed from a single crystal, so that there are no grain boundaries. Although many crystal grains are present in the component in the case of directionally solidified components, the latter are nearly identical with respect to their crystal orientation and, in particular, they are oriented in a preferred direction so as to exploit the special properties along the preferred direction.

Because the production of such components is very complicated, an attempt has already been made to produce such components by generative methods as well and this can be advantageous in the case of small-scale serial production, for example. Examples of this are described in EP 0 861 927 A1, EP 0 892 090 A1, WO 2004/028786 A1, WO 2013/029959 A1, or DE 10 2009 051 479 A1.

However, there continues to be a need for improving the known methods in order to improve the quality of the single-crystalline or directionally solidified components produced and to be able to use the method reproducibly on an industrial scale. In particular, a method that enables the targeted control of the construction in layers is needed in order to be able to adjust the anisotropy properties of the produced component in a defined manner.

BRIEF SUMMARY OF THE INVENTION

Object of the Invention

The object of the present invention is therefore to provide a generative method for producing, in particular, single-crystalline or directionally solidified components, said method affording reproducible and reliable results of high quality in regard to the targeted solidification, in particular the single-crystal properties of single-crystalline solidified components or the uniform orientation of the crystallites in directionally solidified components. At the same time, it should be possible to apply the method in a simple and effective manner.

Technical Solution

This object is achieved by a method of the present invention. Advantageous embodiments are set forth in the claims.

The present invention derives from the realization that an improvement in terms of the above-mentioned object being posed can be achieved in that, in a generative production method involving melting of powder material in layers by a high-energy beam and solidification of the powder melt, the high-energy beam is chosen such that it has a cross section that is altered relative to a circular cross section in the area of its impingement on the powder material. Alternatively or additionally, the beam energy can be distributed non-uniformly, in particular asymmetrically or eccentrically, over the beam cross section of the high-energy beam in the area of its impingement on the powder material. According to another embodiment, which can be implemented alternatively or additionally in turn, the powder material can be irradiated, after melting has occurred, by a high-energy beam at least one second time at an interval in time after the melting, said high-energy beam bringing about an altered energy input into the powder material in comparison to the melting. All of these measures enable a targeted solidification of the melted powder material in a simple but simultaneous manner. In particular, it is possible to achieve an epitaxial growth of the material deposited in layers in order to thereby produce single-crystalline or directionally solidified components. Of course, the method parameters can also be chosen such that a globulitic solidification is achieved. Depending on the case of application, the method parameters can be adjusted such that a desired solidification structure will be obtained.

The two or multiple irradiations of the same powder material with different irradiation energies at intervals in time can be accomplished by irradiation of the powder material or the component with two or more high-energy beams, which can be generated independently of one another.

In this process, the irradiation with a second beam or with additional high-energy beams can occur at times when the powder material that has been melted by the first irradiation has not yet solidified and, in particular, has not yet fully solidified.

Similarly to the case of energy input into the melted powder material by using a plurality of high-energy beams after melting has occurred, the melting of the powder material can also be brought about by a plurality of high-energy beams, which, in particular, act successively on the powder material at intervals in time. Moreover, it is also possible to preheat the powder material with high-energy beams as well as with other heating devices.

The high-energy beams can be laser or electron beams.

In the proposed invention, the generative production of the component by melting of powder material in layers can be accomplished in that the high-energy beam or beams are directed along movement tracks over the powder material, which is arranged in a powder bed.

The movement tracks along which the high-energy beams are directed can overlap one another, in particular, in order to accomplish multiple irradiation of the same powder material or the already melted and/or re-solidified powder material even with a single high-energy beam. Of course, the tracks of movement can also be chosen such that the movement tracks, depending on the respective beam cross section, do not overlap one another in the area of impingement on the powder material.

Furthermore, the track separation can be suitably chosen in order to adjust the desired temperature distribution in the powder material or the melt and the already solidified component.

Overall, a computer-assisted simulation of the energy input and the local temperature distribution and/or the temperature distribution over time in the powder material and/or in the already produced component and/or in the melt can be generated so as, by means of the computer-assisted simulation, to be able to adjust the method parameters such that the desired solidification structure, such as, for example, a globulitic structure or, in particular, a single-crystalline or directional solidification of the component is achieved. The proposed method therefore offers the possibility of targeted control of the solidification of the deposited material layers and thus the targeted exploitation of anisotropy effects of the material through defined solidification.

To this end, the phase state of the powder material and/or the solidification direction and/or the solidification rate of the melted powder material can be determined by the computer-assisted simulation, so that, through variation of one or more parameters of the irradiation with the high-energy beam, it is possible to adjust the desired deposition. Thus, the parameters of the high-energy beams can be adjusted or varied in terms of the power of the high-energy beam or beams, the number of high-energy beams, the shape of the beam cross section of the beam or beams, the non-uniform, particularly asymmetric or eccentric energy distribution over the beam cross section of the high-energy beam or beams, the time interval of a second irradiation or of additional irradiations of the powder material, the geometry of the tracks of the high-energy beams, and the track separation of the tracks of movement of the high-energy beams.

In particular, it is possible in this way to achieve an epitaxial growth of material during deposition in layers. In addition, it is possible to adjust various orientations of the solidified crystallites, so that, for example, different crystal orientations can be adjusted in differently deposited layers. Thus, it is possible to adjust a different crystal orientation in each deposited layer or after a plurality of identical layers. In this way, anisotropy effects can be utilized even in globulitically solidified structures if, in the individual layers or plurality of layers, separated and differently oriented crystallites are present, but are still oriented in a defined manner.

Accordingly, computer-assisted simulation enables the parameters for the irradiation to be chosen in such a way the solidification conditions are such that single-crystalline or directionally solidified components can be produced.

BRIEF DESCRIPTION OF THE FIGURES

The appended drawings show in a purely schematic manner.

DETAILED DESCRIPTION OF THE INVENTION

Further advantages, characteristics, and features of the present invention will be elucidated in the following detailed description of an exemplary embodiment, with the invention not being limited to this exemplary embodiment.

Figure 1:
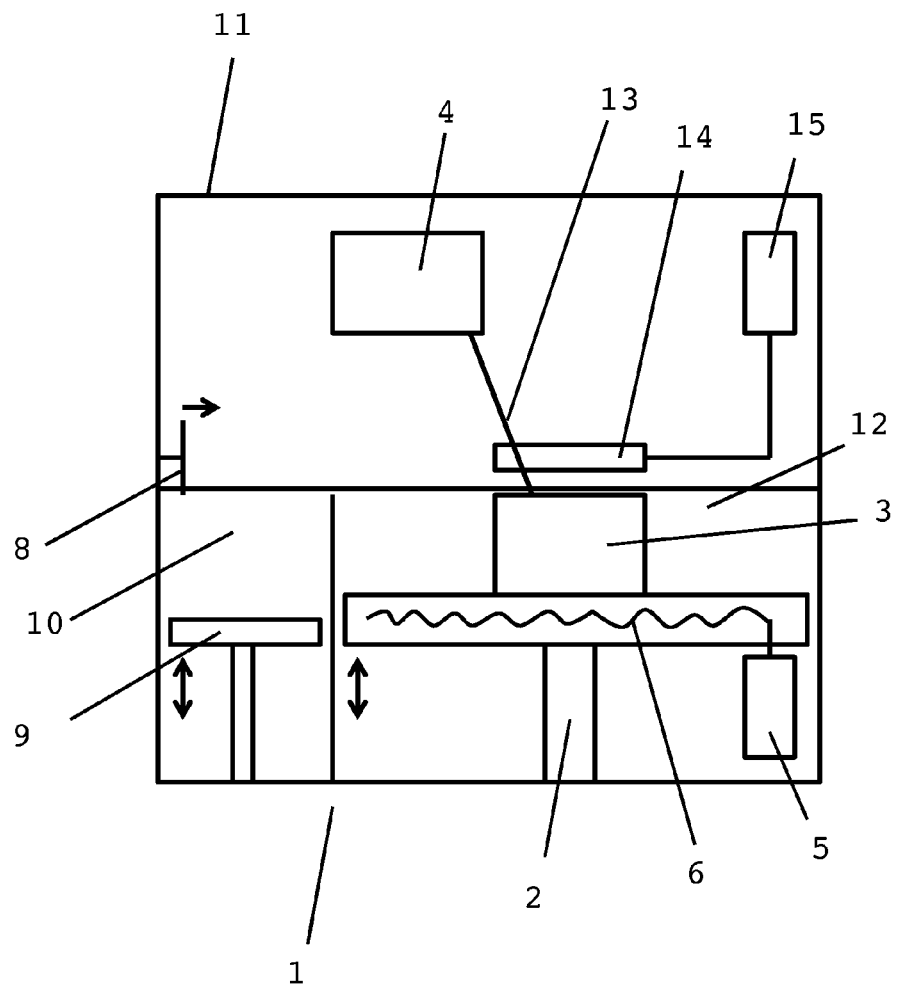
FIG. 1 is a schematic illustration of a device for the generative production of components as exemplified by selective laser melting.

FIG. 1 shows a purely schematic illustration of an apparatus 1, such as may be used, for example, for selective laser melting for the generative production of a component. The apparatus 1 comprises a lift table 2, on the platform of which a semi-finished product 3 is arranged, on which a material is deposited in layers in order to produce a three-dimensional component. To this end, powder 10, which is situated above a lift table 9 in a powder hopper, is pushed layer by layer over the semi-finished product 3 by means of a slider 8 and subsequently bonded to the already present semi-finished product 3 by melting brought about by the laser beam 13 of a laser 4. The bonding of the powder material in a powder layer with the semi-finished product 3 is brought about by the laser 4 regardless of the desired contour of the component being fabricated, so that any desired three-dimensional shapes can be produced. Accordingly, the laser beam 13 is directed over the powder bed 12 in order to melt powder material, corresponding to the contour of the three-dimensional component in the sectional plane corresponding to the produced sectional plane, by way of different points of impingement on the powder bed and to bond them with the already produced part of a component or an initially already prepared substrate. In the process, the laser beam 13 can be directed by a suitable deflecting device over the surface of the powder bed 12 and/or the powder bed could be moved relative to the laser beam 13.

In order to prevent undesired reactions with the surrounding atmosphere during melting or sintering, the process can take place in an enclosed space, which is provided by a housing 11 of the apparatus 1, and, in addition, an inert gas atmosphere can be provided in order to prevent, for example, oxidation of the powder material and the like during deposition. Nitrogen, which is supplied via a gas source that is not illustrated, may be used as inert gas, for example.

In place of the inert gas, a different process gas could also be used, if, for example, a reactive deposition of the powder material is desired.

Moreover, other types of beams are also conceivable, such as, for example, electron beams or other particle beams or light beams that are used in stereolithography.

For adjustment of the desired temperatures in the produced component 3 and/or in the powder bed 12, an electric resistance heater with a resistance heating control 5 and an electric heating wire 6 is provided in the lift table, so that the powder bed 12 and the component 3 can be brought to a desired temperature by appropriate heating from below and/or a desired temperature gradient, in particular one in relation to the just processed layer at the surface of the powder bed, can be adjusted. In a similar manner, heating with a heating device from the top side of the powder bed 12 and the already produced component 3 is provided and, in the exemplary embodiment shown, said heating device is constituted by an induction heater with an induction coil 14 and an induction heating control 15. In this process, the induction coil 14 surrounds the laser beam 13 and, as needed, can be moved parallel to the surface of the powder bed 12 depending on the laser beam 13.

In place of the illustrated induction heating, any other type of heating that enables a heating of the powder bed 12 and the already produced component 3 from the top side can be provided, such as, for example, radiant heating devices, such as infrared emitters and the like. In the same way, the resistance heater 5, 6 can also be replaced by other suitable types of heaters that enable a heating of the powder bed 12 and the already produced component 3 from below. Moreover, other heating devices can be provided surrounding the already produced component 3 and/or the powder bed 12 in order to make possible lateral heating of the powder bed 12 and/or the already produced component 3.

Besides heating devices, cooling devices or combined heating/cooling devices can also be provided in order to be able to perform, in addition to a heating of the already produced component 3 and the powder bed 12, also a targeted cooling so as to be able to adjust and influence in a targeted manner the temperature balance in the powder bed 12 and/or the produced component 3, particularly with respect to the powder layer melted by the laser beam 13 and the solidification front at the melted powder material.

Figure 2:
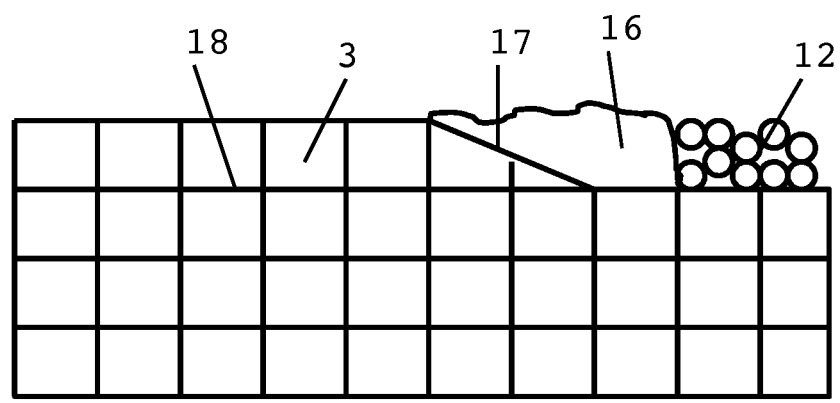
FIG. 2 is a partial sectional view through an already produced component and the powder bed with the melted and solidified area.

FIG. 2 shows the situation in the area of an additional layer in the area of the solidification front that is to be applied directly to the already produced component 3.

In FIG. 2, a part of the already produced component 3 can be seen as well as a part of the powder bed 12 with the powder particles prior to melting. Next to the powder particles of the powder bed 12 is the melt 16 of the already melted powder material after the laser beam 13 has impinged on the powder material of the powder bed 12. Because the laser beam 13 is directed further over the powder bed 12 to produce the contour in the corresponding layer of the component, the melt 16 cools again after irradiation by the laser beam 13, so that solidification of the melted powder material ensues. In the process, regardless of the temperature distribution in the melt 16 and the surrounding areas, a solidification front 17 is formed, which progresses in the direction of the melt 16 and in the direction of the adjusted and directional temperature gradient and at which the melted material is transformed into solidified material.

In accordance with the invention, the energy is input through the laser beam or beams 13 and the heating devices 5, 6, 14, 15 so that the desired solidification structure and crystal orientation are achieved. By means of a slow rate of solidification, that is, slow progression of the solidification front 17 with a simultaneously high temperature gradient at the solidification front, a planar single-crystalline solidification of the melted powder material or an epitaxial growth of the latter occurs on the already produced component 3. This is schematically highlighted in FIG. 2 by illustration of a uniform lattice 18, which represents the uniform crystal structure of the already produced component 3 and the solidified melt 16 at the solidification front 17.

Figure 3:
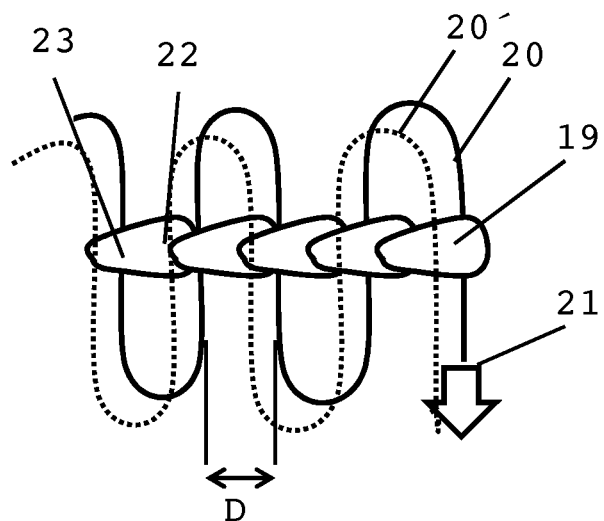
FIG. 3 is an illustration of the tracks of movement and the beam cross section of laser beams during implementation of the method according to the invention.

FIG. 3 shows, in a schematic illustration, the movement of one or more laser beams 13 over the powder bed 12. As illustrated in FIG. 3, the laser beam moves, for example, in the form of a meandering movement track 20 over the powder material present in the powder bed 12. In the case of the movement track 20, the laser beam 13 moves in the direction of the arrow 21 along the movement track 20.

The beam cross section 19 in the area of the impingement face of the laser beam on the powder material is not circular in the exemplary embodiments shown, but rather has a rounded wedge shape. At the same time, the beam energy distribution is non-uniform over the beam cross section and is indeed such that, in the area of the thicker end of the wedge-shaped beam cross section, there is a higher beam energy per unit area than in the pointed end of the wedge-shaped beam cross section. This means that the beam cross section 19 has a greater melting area 22 in terms of its diameter and a smaller post-heating area 23 in terms of its diameter. As a result, the beam energy is distributed non-uniformly over the beam cross section 19 and is indeed such that, in the melting area 22, there is a higher beam energy than in the post-heating area 23.

The movement track 20 of the laser beam 13 is then shaped such that, in the case of the meandering track, the parallel track segments are separated by a distance D that is smaller than the longitudinal extension of the beam cross section 19, so that the beam cross section 19 at least partially overlaps the already irradiated area. In particular, the laser beam 13 is directed along the movement track 20 such that the post-heating area 23 of the beam cross section 19 overlaps during further movement of the laser beam 13 in the area in which the powder material had previously been melted by the melting area 22 of the beam cross section 19. In this way, it is possible to use a single laser beam 13 to bring about the melting and the requisite post-heating so as to achieve a low rate of solidification and/or a high temperature gradient in a simple manner.

Alternatively or additionally, it is possible to direct a second laser beam in temporal succession on the same movement track 20 and/or simultaneously and/or at a time delay on a second movement track 20', which is spatially offset with respect the first movement track 20, in order to adjust, in conjunction with the heating devices 5, 6, 14, 15, the desired temperature distribution in the area of the powder bed 12, the melt 16, the solidification front 17, and the already produced component 3, so that an epitaxial growth of the solidifying powder material on the already produced component 3 or on a provided substrate occurs.

The measures described make it possible to control the temperature conditions in the melt and surroundings and thus the magnitude and direction of the temperature gradient at the solidification front as well as its rate and direction during passage through the melt and hence the solidification direction and the orientation of the solidified crystallite or crystallites.

In place of a completely epitaxial growth to obtain a single-crystalline component, it is possible, depending on the chosen method parameters, also to achieve a directionally solidified growth so as to create a component with a plurality of crystal grains, which are oriented along a preferred direction. In addition, globulitically solidified structures can be produced.

Although the present invention has been described in detail on the basis of exemplary embodiments, it is understandable to the person skilled in the art that the invention is not limited to these exemplary embodiments, but rather alterations are possible in such a manner that individual features can be omitted or other types of combinations of features can be implemented, as long as there is no departure from the protective scope of the appended claims. The present disclosure includes all combinations of the individual features presented.

The invention claimed is:

1. A method for the generative production of components for turbomachines, in which the component is constructed in layers on a substrate or a previously produced part of the component (3), wherein a construction in layers results by melting of powder material in layers with a high-energy beam (13) and solidification of the powder melt (16),
wherein
the high-energy beam has a beam cross section (19) in the area of its impingement on the powder material that is altered in comparison to a circular or other symmetrical cross section and/or the beam energy is distributed, over the beam cross section, in a shape that is selected from the group consisting of non-uniform, asymmetrical and eccentric, and that
the powder material, after melting has occurred, is irradiated a second time, at a time delay to the melting, by a high-energy beam with an energy input into the powder material that is altered in comparison to the melting, and
wherein the solidification of the powder melt occurs epitaxially.

2. The method according to claim 1,
wherein
at least two high-energy beams (13) are irradiated on the powder material in temporal succession at spatially adjacent sites of the component or a part thereof.

3. The method according to claim 1,
wherein
the second irradiation or additional irradiations with a high-energy beam (13) occurs or occur at time points when the melted powder material has not yet fully solidified.

4. The method according to claim 1, further comprising the step of:
preheating the powder material by radiant heating or induction heating, prior to the melting.

5. The method according to claim 1,
wherein
the high-energy beam (13) is a laser or electron beam.

6. The method according to claim 1,
wherein
at least one high-energy beam is directed along movement tracks (20, 20') over the powder material arranged in a powder bed.

7. The method according to claim 6,
wherein
the tracks of movement (20, 20') of the high-energy beams with beam cross section (19) that deviates from circular or otherwise symmetrical cross section and/or non-uniform and/or asymmetrical and/or eccentric energy distribution over the beam cross section, and/or the movement tracks for which the high-energy beam impinges for the first time on the powder material at least partially for melting of the powder material overlap one another.

8. The method according to claim 1,
wherein
a computer-assisted simulation of the energy input and the local and/or temporal temperature distribution in the powder material and/or the already produced component (3) takes place.

9. The method according to claim 1,
wherein
a computer-assisted simulation of the phase state of the powder material and/or the direction of solidification and/or the rate of solidification of the melted powder material takes place.

10. The method according to claim 8,
wherein
by a computer-assisted simulation, one or more parameters for the irradiation with high-energy beams is or are determined, wherein said parameters are chosen from the group that includes the power of the high-energy beam or beams, the number of high-energy beams, the shape of the beam cross section of the beam or beams, the non-uniform, asymmetric or eccentric energy distribution of the high-energy beam or beams over the beam cross section, the time interval of a second irradiation or of additional irradiations of the powder material, the geometry of the tracks of the high-energy beams, and the track separation of the movement tracks of the high-energy beams.

11. The method according to claim 10,
wherein
by a computer-assisted simulation, the parameters for irradiation with high-energy beams are determined so that a desired structure can be created.

12. The method according to claim 1,
wherein
the method is used for the production of single-crystalline or directionally solidified components.

13. The method according to claim 9, wherein
by a computer-assisted simulation, one or more parameters for the irradiation with high-energy beams is or are determined, wherein said parameters are chosen from the group that includes the power of the high-energy beam or beams, the number of high-energy beams, the shape of the beam cross section of the beam or beams, the non-uniform, asymmetric or eccentric energy distribution of the high-energy beam or beams over the beam cross section, the time interval of a second irradiation or of additional irradiations of the powder material, the geometry of the tracks of the high-energy beams, and the track separation of the movement tracks of the high-energy beams.

* * * * *